(12) United States Patent
Yasoda et al.

(10) Patent No.: US 6,272,962 B1
(45) Date of Patent: Aug. 14, 2001

(54) CUTTING BLADE

(75) Inventors: Hisashi Yasoda, Ishikawa-ken; Noriyuki Wakabayashi, Aichi-ken, both of (JP)

(73) Assignee: UHT Corporation, Aichi-ken (JP)

( * ) Notice: Subject to any disclaimer, the term of this patent is extended or adjusted under 35 U.S.C. 154(b) by 0 days.

(21) Appl. No.: 09/376,290

(22) Filed: Aug. 18, 1999

(51) Int. Cl.$^7$ ........................................... B26D 1/00
(52) U.S. Cl. ............................... 83/694; 83/697; 83/686; 83/929.1
(58) Field of Search ................. 83/697, 698.91, 83/929.1, 699.11, 686, 694; 125/23.01, 24

(56) References Cited

U.S. PATENT DOCUMENTS

| | | | |
|---|---|---|---|
| 3,857,311 | * 12/1974 | Esser | 83/697 |
| 3,962,939 | * 6/1976 | Stengle, Jr. | 83/694 |
| 4,132,138 | * 1/1979 | Miyamoto | 83/697 |
| 4,543,373 | 3/1987 | Gerber . | |
| 4,653,373 | * 3/1987 | Gerber | 83/697 |
| 4,754,677 | * 7/1988 | McKindary | 83/697 |
| 5,377,454 | 1/1995 | Pedersen et al. . | |

FOREIGN PATENT DOCUMENTS

| | | |
|---|---|---|
| 62-173194 | 7/1987 | (JP) . |
| 63-197089 | 5/1988 | (JP) . |
| 7506059 | 7/1995 | (JP) . |

* cited by examiner

Primary Examiner—M. Rachuba
(74) Attorney, Agent, or Firm—Greenblum & Bernstein P.L.C.

(57) ABSTRACT

A cutting blade includes a shank portion and a cutting portion having a predetermined length and opposed sides, and affixed to the shank portion. The cutting portion has a cutting edge portion having a predetermined length and opposed sides and a continuous portion which continuously extends from the cutting edge portion to the shank portion, so that blade thickness gradually increases in a direction towards the shank portion. The cutting portion further has at least one pair of opposed concave curved surfaces substantially symmetrical to each other with respect to a center line, each opposed concave surface axially extending in a direction substantially parallel to the length of the cutting edge portion and provided on at least one of the cutting edge portion and the continuous portion. Also provided is a plurality of arcuate surfaces provided on at least one of the opposed sides of the cutting edge portion, and the opposed concave curved surfaces, each arcuate surface extending along the continuous portion in a direction substantially orthogonal to the length of the cutting edge portion.

6 Claims, 5 Drawing Sheets

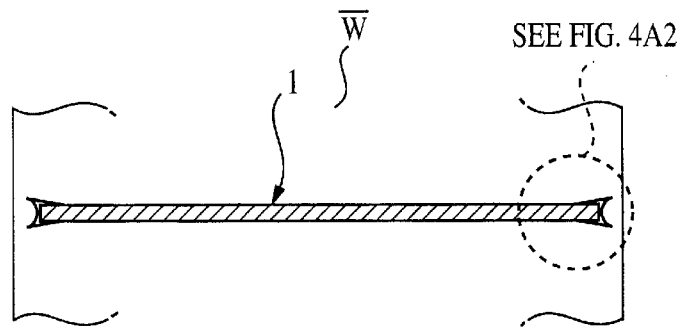
PRIOR ART
FIG. 4A1
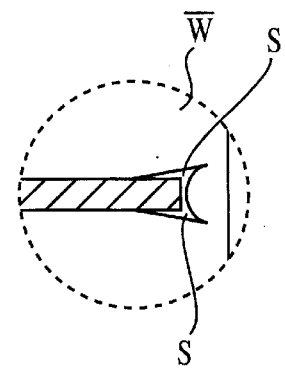
PRIOR ART
FIG. 4A2
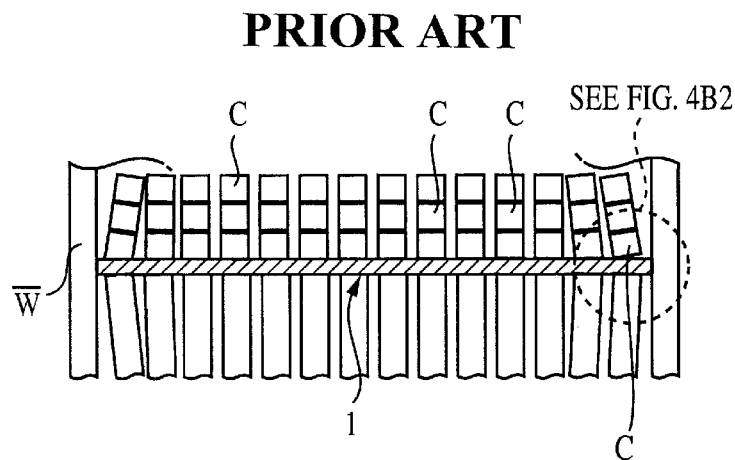
PRIOR ART
FIG. 4B1
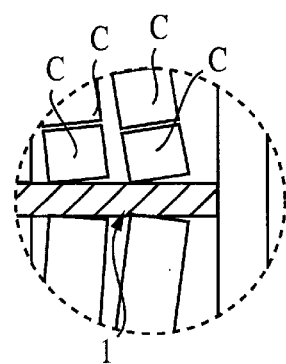
PRIOR ART
FIG. 4B2

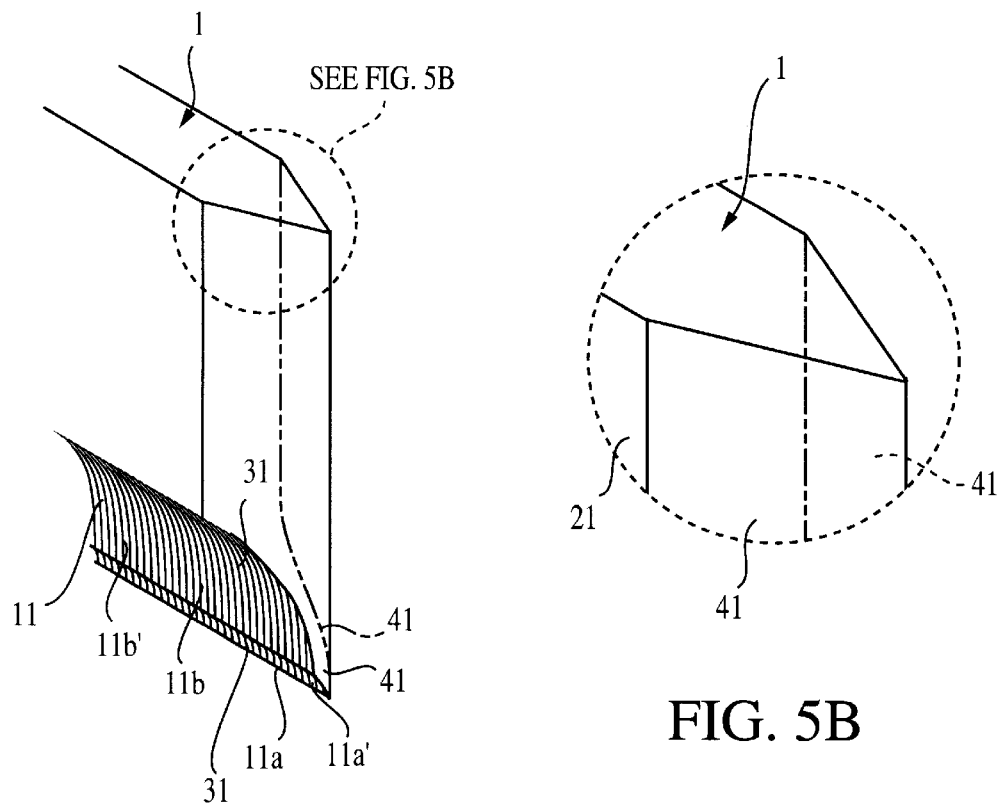
FIG. 5A
FIG. 5B
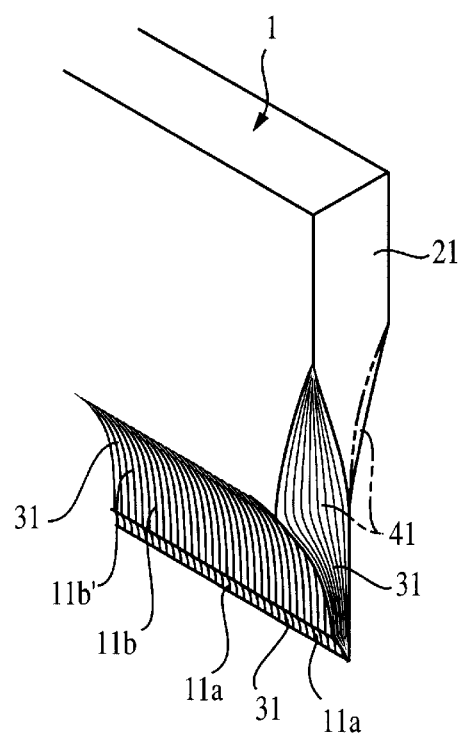
FIG. 6

CUTTING BLADE

BACKGROUND OF THE INVENTION

1. Field of the Invention

The present invention relates to a flat cutting blade for use in a cutting machine and, more particularly, to a cutting blade for cutting a sheet-like substrate such as a ceramic green sheet.

2. Description of Related Art

There is a cutting machine suitable for getting a plurality of chips by cutting, into a form of checkers, a sheet-like substrate (material sheet) such as a ceramic green sheet before sintering. The cutting machine is designed to cut with a flat cutting blade pressed like a guillotine against a work at a given spacing (pitch feed). The overall cutting section of the cutting blade thus used is formed in a shape of a sharp V-edge in a front view.

With a recent tendency to down-size electronic equipment, there has been a demand for small chips measuring for example 0.6 mm long by 0.3 mm wide. To cut a work by pressing a guillotine type double-edged cutting blade mentioned above while maintaining a given working accuracy, it becomes necessary to decrease the edge angle to minimize deformation of a cut surface of the work.

This type of cutting blade, therefore, is provided with a edge angle of around 10 deg. to 30 deg. and a shank thickness of around 1 mm.

This type of cutting blade is detachably mounted on a vertically movable tool holder of a cutting machine not depicted, and a centering camera is mounted on a supporting body of the tool holder, so that the centering camera will make an exposure of a pair of line marks provided in opposite positions at an equal spacing on the edges of a work (on four edges in the case of a rectangular work) every time the work is fed for a specific amount each pitch. Furthermore an image thus obtained is processed to center the line marks, and, after moving by the amount of correction to correct an index table on which the work is held by adsorption, the cutting blade is fed downwardly to cut the work.

This operation is repeated every time of pitch feed in a given direction of length of the work, and after the completion of operation in one direction, the work W on the index table is turned through 90 degrees and is cut in a like manner as described above, thereby making chips.

At this time, the four edges carrying the line marks are unsuitable for use as cut chips because of the presence of the line marks. Therefore, it is a mainstream of a cutting method to cut a work into a form of checkers, leaving the cutting edge portion of the work in the form of a frame.

However, if the edge angle is formed much smaller without altering the blade thickness (thickness of the shank portion), the surface area of the edge surfaces (cutting portion) on both right and left sides naturally increases; and both the right and left sides work as a great resistance at the time of cutting. Therefore a great cutting force is needed at the time of cutting, with the result that the cutting edge portion will be subjected to buckling deformation.

SUMMARY OF THE INVENTION

In view of the above-described disadvantages inherent to the heretofore known cutting blades, it is an object of the present invention to provide a flat cutting blade which cuts well and has a high buckling strength at the cutting edge portion even at a desired edge angle.

It is another object of the present invention to provide a cutting blade suitable for making microchips.

It is further another object of the present invention to provide a cutting blade which can prevent sideward fall and scattering of chips when a work is cut into a form of checkers to make chips while leaving its edges in the form of frame.

As a technological means for attaining the above-described objects, the gist of first aspect of the present invention is that the cutting blade is a flat cutting blade for cutting a thin plate-like work; the cutting portion formed from the forward end towards the shank portion is comprised of a cutting edge portion formed for a specific length and having right and left concave curved surfaces symmetric with respect to the centerline, and a continuous portion which is continuously formed through from the cutting edge portion to the shank portion so that the blade thickness will gradually increase as it goes towards the shank portion, and is formed of single-stage or multi-stage concave curved surfaces symmetric with respect to the centerline; and that fine vertical lines of projections and depressions are formed by grinding for the entire length of the blade in the same direction as the direction of the curved surface, on both the right and left sides of the cutting edge portion and the concave curved surface of the continuous portion.

According to the technological means stated above, the cutting edge portion having a desired edge angle to perform work cutting has flat or concave curved surfaces formed symmetrical with respect to the centerline for a given length (a minimum required), and a continuous portion connecting the cutting edge portion with the shank portion is connected on the symmetrical concave curved surfaces so that the cutting edge portion will gradually increase as it goes from the rear end (upper end) of the cutting edge portion towards the shank portion, thereby restraining a contact resistance to be added from the continuous portion to the work during cutting operation. Consequently work cutting operation can be done with little cutting force without buckling deformation of the cutting edge portion.

The cutting edge portion cuts well as if shearing with the fine vertical lines of projections and depressions.

Referring to the gist of second aspect of the present invention, both the right and left surfaces of the cutting edge portion stated in first aspect of the present invention is comprised of flat surfaces and are mirror-finished through the entire length of blade, and further that fine lines of projections and depressions are formed, in the concave curved surface of the continuous portion, by grinding over the entire length of the blade in the same direction as the curved surface on said concave curved surface of said continuous portion.

According to the technological means, it is possible to obtain fine cut chips with a beautiful cut surface in addition to the above-described advantages.

To explain the gist of third aspect of the present invention, in the continuous portion, a concave curved surface continuous to the cutting edge portion, and each upper-stage concave curved surface continuous to the lower-stage concave curved surface are formed on a midway and provided with a little thinner portion than the numbered angle at the lower stage, and then the upper-stage concave curved surfaces are symmetrical concave curved surfaces which gradually increase in thickness.

According to the technological means, numbered edge angles include the edge angle designated as No. 1 angle, and upper-stage concave curved surfaces as No. 2 angle, No. 3 angle, and so forth.

Therefore, the symmetrical concave curved surfaces of the upper stage have No. 2 angle and are located immediately above the cutting edge having No. 1 angle. The edge contact with a work of the concave curved surfaces decreases, thereby restraining the cutting resistance of No. 2 angle (symmetrical concave curved surfaces at the upper stage located immediately above the cutting edge portion), thus enabling to cut a work with a less cutting force, that is, to achieve a very good cutting quality.

To give the gist of fourth aspect of the present invention, both ends of the blade in the direction of blade length are V-shaped throughout the blade height as viewed in a plan view. The gist of fifth aspect of the present invention is that both ends of the blade in the lengthwise direction are formed at least in a V-shape in a plan view throughout the blade height of the continuous portion.

According to the technological means, when cutting a work into a checkers form to make chips while leaving the edge of the work in the form of a frame, the cutting blade is fed down to cut into the work; at this time, both ends of the work are likely to be torn and spread as shown in FIG. 4a because the cross section of the cutting edge portion is supposed to be long and rectangular. Chips thus cut tend to fall down or scatter with their elastic recovery force generated at the spread work ends. The spread gives a push-to-move force to adjacent chips after cutting, causing the cut chips to fall down and scatter.

Since both ends of the blade are V-shaped in the direction of blade length through the overall height as viewed in a plan view, it is possible to prevent both ends of the blade from spreading to thereby solve the aforesaid problems.

A material best suited for the above-described cutting blade is a cemented carbide material, which can improve the abrasion resistance of the cutting blade formed into a configuration having a high buckling strength.

The foregoing objects and other objects will become more apparent and understandable from the following detailed description thereof, when read in connection with the accompanying drawings.

BRIEF DESCRIPTION OF THE DRAWINGS

FIG. 2 consists of FIGS. 2A, and 2B, wherein

FIG. 4A consists of FIGS. 4A1 and 4A2, is a cross-sectional plan view of a cutting action of a known cutting edge having a thin, long cross-sectional form, wherein FIG. 4A1 shows both spread ends of the known cutting edge, and FIG. 4A2 shows an enlarged cross-sectional plan view of an end of the known cutting edge;

FIG. 4B consists of FIGS. 4B1 and 4B2, is a cross-sectional plan view of a cutting action of a known cutting edge having a thin, long cross-sectional form, wherein FIG. 4B1 shows the known cutting edge cutting a work into chips, and FIG. 4B2 shows an enlarged cross-sectional partial plan view of the known cutting edge cutting a work into chips;

FIG. 5 consists of FIGS. 5A and 5B, wherein FIG. 5A shows a perspective view of a third embodiment of the present invention, and FIG. 5B shows a perspective view of an enlarged portion of the cutting blade of the third embodiment; and FIG. 6 is a perspective view of a fourth embodiment of the present invention.

DESCRIPTION OF THE PREFERRED EMBODIMENTS

Figure 1:
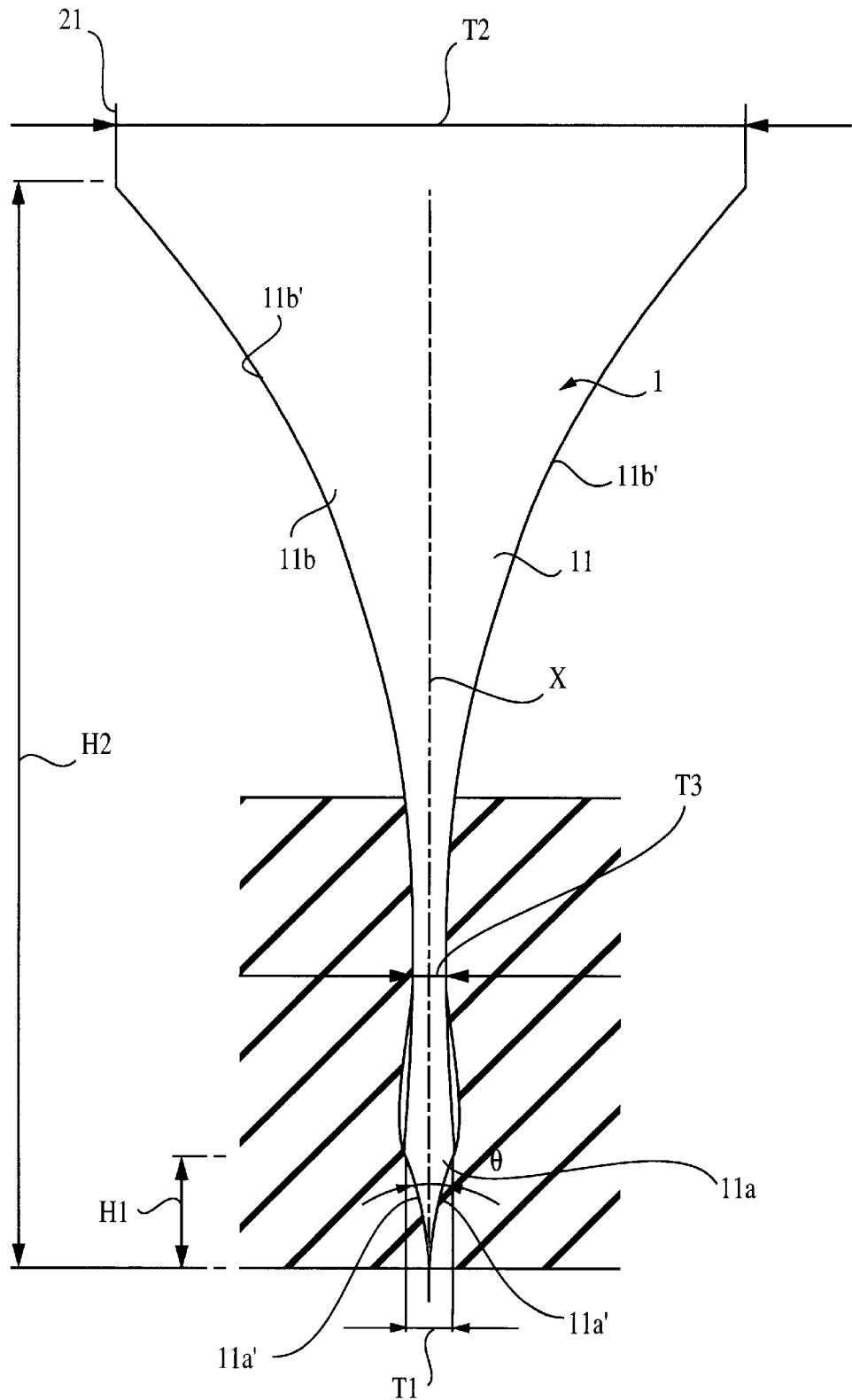
FIG. 1 is an enlarged view of a cutting portion which forms a portion of a cutting blade of a first embodiment of the present invention.
Figure 2A:
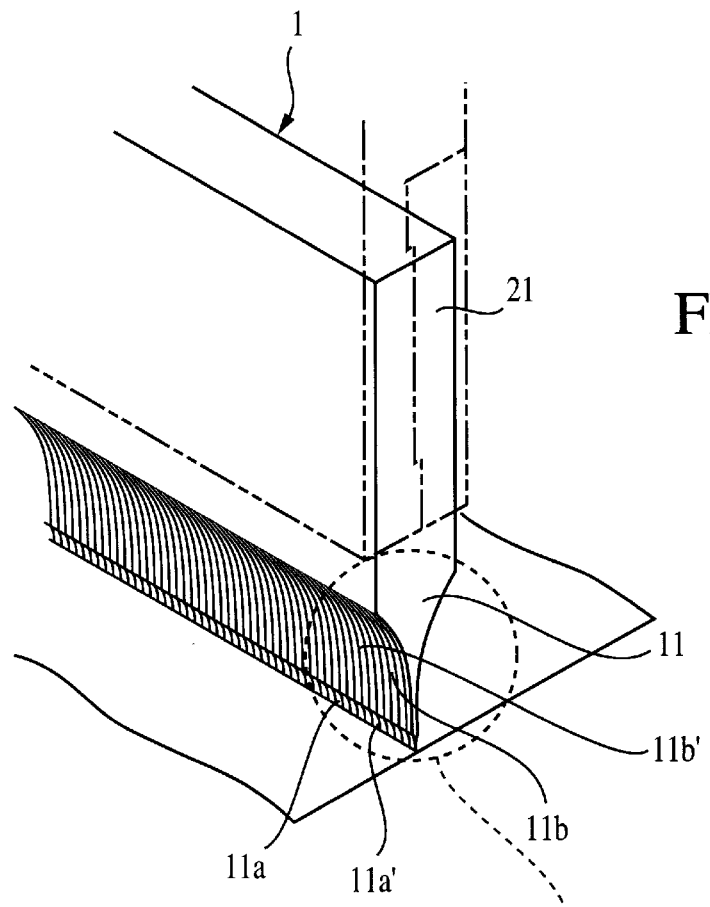
FIG. 2A shows a perspective view of the cutting blade and FIG. 2B shows an enlarged perspective partial view of the cutting blade.
Figure 2B:
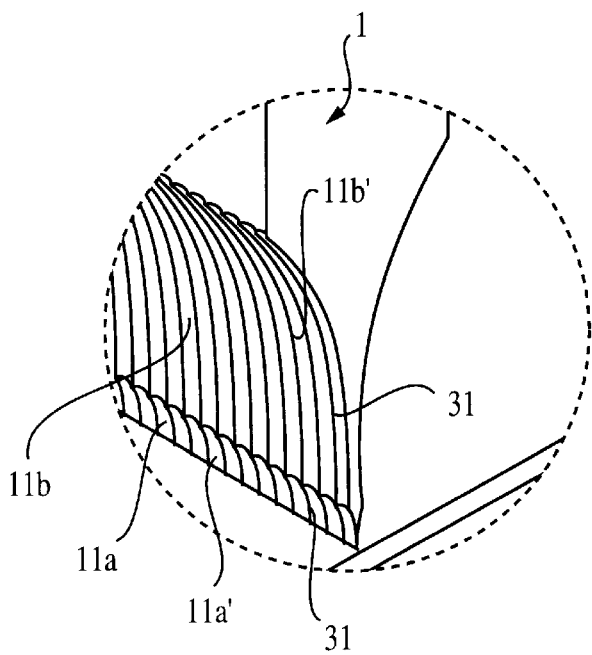
Figure 3:
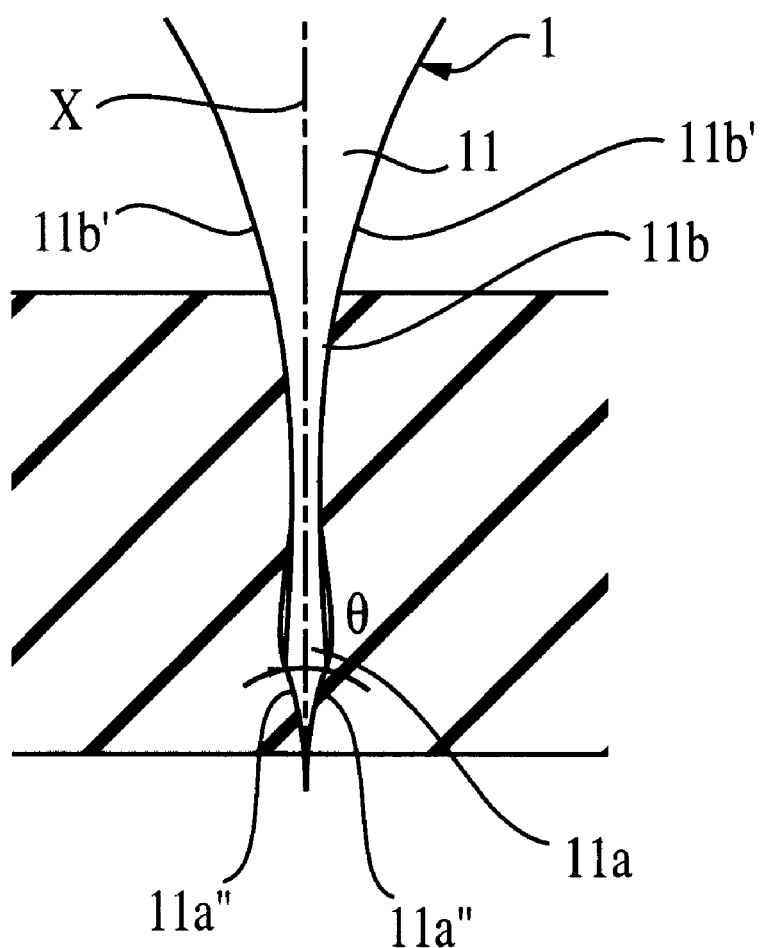
FIG. 3 is an enlarged view of the cutting portion of a second embodiment.

Next, preferred embodiments of a cutting blade according to the present invention will be explained with reference to the accompanying drawings. FIG. 1 and FIG. 2 show the first embodiment; FIG. 3 shows the second embodiment; FIGS. 4a and 4b are reference views; FIG. 5 is the third embodiment; and FIG. 6 is the fourth embodiment. In these drawings, numeral 1 denotes a cutting blade.

First, the first embodiment of the cutting blade will be explained.

A cutting blade 1 shown in FIG. 1 and FIG. 2 is comprised of a flat plate-shaped shank portion 21, and a cutting portion 11 having an increase buckling strength for cutting a work.

The cutting portion 11 is so shaped as to gradually increase in thickness as it goes from the forward end portion towards the shank portion 21, and includes a cutting edge portion 11a (No. 1 angle) having concave curved surfaces 11a' symmetrical with respect to a centerline X and formed at a desired edge angle for a given length, and the first-stage continuous portion 11b formed of symmetrical concave curved surfaces (No. 2 angle) 11b', 11b' with respect to the centerline X continuously formed from the cutting edge portion 11a to the shank portion 21, gradually increasing in thickness as it goes towards the shank portion 21.

The cutting blade 1 is made of a brittle cemented carbide material. In the blade 1, the concave curved surfaces (No. 2 angle) 11b', 11b' forming the blade cutting edge portion (No. 1) 11a and the continuous portion 11b are ground in the same direction as the curved surfaces with a grinding wheel having a grinding surface on a circumferential surface to form the concave curved surfaces at the same curvature as the grinding wheel. On the cutting edge portion (No. 1 angle) 11a and the continuous portion 11b, fine vertical lines of projections and depressions 31 are formed, by grinding, through the entire length of the blade in the direction of the blade edge.

In the present embodiment, concave curved surfaces (No. 2 angle) 11b', 11b' continued to the cutting edge portion (No. 1) 11a are symmetrical surfaces which gradually increase in thickness after passing through a little thinner portion than the cutting edge portion (No. 1 angle) 11a.

The purpose of the above-described blade configuration is for minimizing a cutting edge-to-work resistance at the time the concave curved surfaces (No. 2 angles) 11b40, 11b40 contact the work.

The cutting blade 1 thus formed is attached to a vertically movable tool holder of an unillustrated cutting machine, and is moved up and down to cut a ceramic green sheet (work) W. The cutting edge portion (No. 1 angle) 11a and the continuous portion 11b are formed of the concave curved surfaces 11a' and 11b40, so that the concave curved surfaces (No. 2 angle) 11b40, 11b40 are designed to have a role to escape from the upper cutting edge portion of the ceramic green sheet W to reduce an unnecessary pressure. That is, the concave curved surfaces 11b40, 11b40 of the continuous portion 11b have the same function as the flanks of a cutting tool.

The fine vertical lines of projections and depressions 31 formed for the overall length of the blade improve the cutting quality of the blade, and also serve to increase the strength of the cutting blade 1 (strength of the cutting edge portion 11a and the continuous portion 11b).

Next, a second embodiment will be explained.

FIG. 3 shows an example of the cutting blade 1 having a cutting edge (No. 1 angle) 11a which is provided with inclined flat surfaces 11a" symmetrical with respect to the centerline X and is formed at a desired edge angle which is the same as that of the first embodiment, in place of the cutting edge portion 11a formed of concave curved surfaces in the first embodiment. The cutting blade 1 of the second embodiment is the same in other points of configuration as that of the first embodiment; therefore the same members as those of the first embodiment are designated by the same reference numerals and will not be described. The inclined flat surfaces 11a", 11a" forming both sides of the cutting edge portion (No. 1 angle) 11a have been mirror-finished.

The mirror-finished surfaces of the cutting edge portion 11a are precision surfaces, which can produce fine cut chips.

In the present embodiment, similarly to the preceding embodiment, the concave curved surfaces (No. 2 angle) 11b40, 11b40 continuous to the cutting edge portion (No. 1 angle) 11a are symmetrical concave curved surfaces which gradually increase in thickness after passing through a little thinner portion than the cutting edge portion (No. 1 angle) 11a.

FIGS. 4a and 4b show a phenomenon of a conventional cutting blade during cutting operation.

This phenomenon gives particularly an adverse effect to cutting operation when cut chips C (chips after cutting) are very small chips each measuring 0.6 mm long and 0.3 mm wide.

The phenomenon is the spread S of both ends of the work W after test cutting the work W as shown in FIG. 4a.

The cause of this phenomenon is unknown. Since the cross sectional form of the cutting edge portion is a horizontally long, rectangular form, the work W is torn at two points of square corners between the blade surface and the end face, and a compressive elastic force of the blade surfaces (both the right and left surfaces) at the time of cutting acts in the direction of length of the blade, resulting in the spread S.

Because the spread S exists, when the work W is cut into chips C of checkers form, leaving the edge of the work W in the form of a frame as shown in FIG. 4b, cut chips C at both ends of the cutting blade having the spread S are changed to an inclined orientation, thereby pushing chips C already cut. The cut chips C, therefore, will be caused to jump up or fall down by a reactive force resulting from the push.

FIG. 5 and FIG. 6 show a cutting blade 1 (the third and fourth embodiments) having a means to prevent occurrence of the phenomenon.

In the cutting blade 1 of FIG. 5, both ends, in the direction of length, of the cutting blade of the first or the second embodiment are V-shaped throughout the height in a plan view. In the cutting blade 1 of FIG. 6, the continuous portion 11b at both ends in the direction of blade length is V-shaped through the height at least in a plan view. The V-shaped surface 41 in the cutting blade 1 of FIG. 6 has particularly a concave curved surface of a large curvature. The blade has been ground to form fine vertical lines of projections and depressions 31 by a grinding wheel having a grinding surface on the circumferential surface in the same direction as the curved surface. Probably because of this configuration, the cut chips C did neither jump up nor fall.

The concave curved surface 11a' or inclined plane 11a" of the cutting edge portion (No. 1 angle) 11a and the V-shaped surface 41, and the concave curved surfaces (No.2 angle) 11b40, 11b40 of the continuous portion 11b and the V-shaped surface 41 are continuously formed each at an obtuse angle, to thereby restrict the phenomenon that the ceramic green sheet (work) W is torn by both ends. Accordingly it is supposed that the compressive elastic force acted in the direction of blade length during cutting operation, thereby preventing the occurrence of the spread S.

However, there was hardly found any difference in effect between the cutting blade 1 of FIG. 5 and the cutting blade 1 of FIG. 6.

The thickness T2 of a shank portion 21 of the cutting blade 1 in the first, second, third and fourth embodiments is 0.4 mm to 1.0 mm; the edge angle θ is about 15 deg. to 20 deg.; the maximum thickness (an intersection with the continuous portion 11b) T1 of the cutting edge portion (No. 1) 11a is 25 μm to 50 μm; the height H1 of the cutting edge portion is 50 μm to 100 μm; and the height H2 from the forward end of the cutting edge portion 11a to an intersection with the shank portion 21 of the continuous portion 11b is a little higher than 1 mm. And in the symmetrical concave curved surfaces 11b40, 11b40 which are No. 2 angles, the midway portion T3 located close to the cutting edge portion (No. 1 angle) 11a is gradually increased in thickness after forming midway a portion about 5 μm thinner than the maximum thickness T1, for cutting an about 0.1 mm to 1.0 mm thick work (a thin substrate of a ceramic green sheet) W.

In the embodiment described above, the continuous portion 11b given as an example is a single-stage type. It should be noticed that a distance along the centerline X from the intersection between the continuous portion 11b and the shank portion 21 to the forward end of the cutting edge may be changed to a two-stage type of the same distance as in the first, second, third and fourth embodiments, and furthermore, to other plurality of stages, such as three-stage and four-stage types. In this case also, either of the concave curved surfaces 11b40, 11b40 may be gradually increased in thickness similarly to the first and second embodiments.

In this case, the symmetrical concave curved surfaces 11b40, 11b40 are gradually increased in thickness at No. 3 angle with respect to No. 2 angle, and at No. 4 angle with respect to No. 3 angle, after forming a slightly thin portion similarly to the above-described embodiment.

Furthermore, in the present embodiment, no explanation has been given, in claims 1 and 2, about the continuous portion 11b which is formed of symmetrical single-stage or multi-stage concave curved surfaces 11b40 continuously formed, gradually increasing in thickness as it goes from the cutting edge portion 11a to the shank portion 21. The continuous portion, however, is not formed of concave curved surfaces which gradually increase in thickness after passing through a thin portion in. No. 2 angle with respect to No. 1 angle, No. 3 angle with respect to No. 2 angle, and No. 4 angle with respect to No. 3 angle, but is formed of symmetrical concave curved surfaces which gradually increase in thickness in order from the numbered angle at each lower stage.

Therefore, although restraining the edge-to-work contact resistance can not be expected so much as in the case of the symmetrical concave curved surfaces which gradually increase in thickness after passing through a little thin portion with respect to the cutting edge portion (No. 1), it is possible to reduce the edge-to-work contact resistance during cutting operation as compared with a conventional cutting blade having generally a sharp V-shaped edge surface in a front view.

According to claims 1 and 2, the cutting portion formed from the forward end of the edge to the shank portion is a cutting blade comprised of a cutting edge portion formed, for cutting a thin plate-like work such as a ceramic green sheet, to the minimum necessary limit (minimum necessary angle) of symmetrical plane or concave curved surfaces with respect to the centerline, and a continuous portion formed of symmetrical single-stage or multi-stage concave curved surfaces which are continuously formed through from the cutting edge portion to the shank portion so that the blade thickness will gradually increase in thickness as it goes towards the shank portion. Therefore, it is possible to restrain the work-to-continuous portion (concave curved surface) contact resistance during cutting operation as compared with the conventional cutting blade which is formed generally of a sharp V-shaped edge in a front view, thereby enabling work cutting with a little cutting force while preventing buckling deformation of the cutting edge portion.

Furthermore, the provision of the fine vertical lines of projections and depressions can greatly improve the cutting quality of the cutting blade and also increase reliability of the buckling strength of the continuous portion as well as the cutting edge portion.

Furthermore, since the continuous portion where the cutting edge portion is continuous to the shank portion is formed of symmetrical single-stage or multi-stage concave curved surfaces which gradually increase in blade thickness, little pressure is exerted from the continuous portion to the upper cutting edge portion of a thin work to be cut. The work, therefore, will be less liable to deformation.

Furthermore, because either of the cutting edge portion and the continuous portion has a symmetry with respect to the right and left sides, reactive forces working in the directions perpendicular to the centerline during cutting remain equal and will not affect a balanced internal stress; therefore the cutting blade will get neither warped nor broken.

According to claim 2, the mirror-finished edge surface is a beautiful cutting surface, which is best suited for cutting fine chips.

Furthermore, according to claim 3, in the continuous portion, the concave curved surface continued to the cutting edge portion and the concave curved surface at the upper stage continued to the concave curved surface at the lower stage are symmetrical concave curved surfaces which gradually increase in thickness after forming a portion midway which is a little thinner than the numbered angle at the lower stage. It is, therefore, possible to minimize the contact resistance of the concave curved surface of each numbered angle except the cutting edge portion to the work during cutting operation, thereby providing the optimum cutting blade for work cutting with a little cutting force to produce fine chips without buckling deformation of the cutting edge portion.

According to claims 4 and 5, because the concave curved surfaces or inclined planes at the cutting edge portion and the V-shaped surface, and the concave curved surface of the continuous portion and the V-shaped surface are continued each at an obtuse angle, there occurs little phenomenon to tear the work at both ends. When gaining chips by cutting the work into a checkers form while leaving the edge in the form of frame as shown in FIG. 4, the edge will not be spread if a compressive elastic force acts in the direction of blade length at the time of cutting. Therefore it is possible to prevent such an accident likely to arise with a conventional cutting blade as scattering of cut chips and adjacent chips after cutting.

Having described specific preferred embodiments of the present invention with reference to the accompanying drawings, it will be appreciated that the present invention is not limited to those precise embodiments, and that various changes and modifications can be effected therein by one of the ordinary skill in the art without departing from the scope of the invention as defined by the appended claims.

What is claimed is:

1. A cutting blade comprising:

a shank portion; and a cutting portion having a predetermined length and opposed sides, said cutting portion affixed to said shank portion and comprising:

a cutting edge portion having a predetermined length and opposed sides;

a continuous portion which continuously extends from said cutting edge portion to said shank portion, wherein blade thickness gradually increases in a direction towards said shank portion;

at least one pair of opposed concave curved surfaces substantially symmetrical to each other with respect to a centerline, the centerline being substantially orthogonal to the length of said cutting portion, each said opposed concave surface extending axially in a direction substantially parallel to said length of said cutting portion and present on at least one of said cutting edge portion and said continuous portion;

a plurality of arcuate surfaces provided on at least one of said opposed sides of said cutting edge portion and said opposed concave curved surfaces, each arcuate surface of said plurality of arcuate surfaces extending along said continuous portion in a direction substantially orthogonal to said length of said cutting portion.

2. The cutting blade according to claim 1, wherein:

both said opposed sides of said cutting edge portion are mirror-finished flat surfaces substantially extending along the entire length of said cutting portion; and said plurality of arcuate surfaces are provided on said opposed concave curved surfaces and extend substantially along the entire length of said cutting portion.

3. The cutting blade according to claim 1, wherein said at least one pair of opposed concave curved surfaces are multi-stage and comprise:

a first pair of opposed concave curved surfaces adjacent to said cutting edge portion; and at least one pair of successive opposed concave curved surfaces, each pair of successive opposed concave curved surfaces of said at least one pair of successive concave curved surfaces extending from a preceding pair of said opposed concave curved surfaces in a direction towards said shank portion, formed at an intermediate portion of said cutting portion, and provided with a portion thinner than a portion of said preceding pair of said opposed concave curved surfaces.

4. The cutting blade according to claim 1, wherein at least one end of said cutting portion has a substantially "V"-shaped end blade extending therealong in a direction substantially parallel to the centerline.

5. The cutting blade according to claim 1, wherein said continuous portion has opposed sides which collectively generally form a "V"-shape prismatically generally extending along the length of said cutting edge portion.

6. The cutting blade according to claim 1, wherein said arcuate surfaces uninteruppdedly extend along said continuous portion.

* * * * *